US010862388B1

(12) United States Patent
Gozzini et al.

(10) Patent No.: US 10,862,388 B1
(45) Date of Patent: Dec. 8, 2020

(54) CURRENT MODE POWER CONVERTER WITH TRANSIENT RESPONSE COMPENSATION

(71) Applicant: Apple Inc., Cupertino, CA (US)

(72) Inventors: Fabio Gozzini, San Jose, CA (US); Jonathan F. Bolus, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/509,234

(22) Filed: Jul. 11, 2019

(51) Int. Cl.
*H02M 1/088* (2006.01)
*H03K 3/037* (2006.01)
*H02M 3/158* (2006.01)
*H02M 1/00* (2006.01)

(52) U.S. Cl.
CPC .......... *H02M 1/088* (2013.01); *H02M 3/158* (2013.01); *H03K 3/037* (2013.01); *H02M 3/1588* (2013.01); *H02M 2001/0006* (2013.01); *H02M 2001/0009* (2013.01); *H02M 2001/0012* (2013.01); *H02M 2001/0025* (2013.01); *H02M 2001/0029* (2013.01)

(58) Field of Classification Search
CPC ........ H02M 1/32; H02M 1/088; H02M 3/158; H02M 2001/0032; H02M 2001/0009; H02M 2001/0006; H02M 3/1588; H02M 2001/0029; H02M 2001/0012; H02M 2001/0025; H03K 3/037; Y02B 70/16; G05F 1/40
USPC ...... 363/17, 21.12, 21.13, 21.17, 65, 97, 98; 323/222, 224, 235
See application file for complete search history.

(56) References Cited

U.S. PATENT DOCUMENTS

| 7,019,506 | B2 * | 3/2006 | Kernahan | G05F 3/262 323/284 |
|---|---|---|---|---|
| 7,893,678 | B2 | 2/2011 | Blanken | |
| 8,405,370 | B2 | 3/2013 | Chen | |
| 9,397,559 | B2 | 7/2016 | Tournatory | |
| 9,877,772 | B2 | 1/2018 | Erickson et al. | |
| 2003/0231012 | A1 * | 12/2003 | Corva | H02M 3/156 323/285 |
| 2010/0039836 | A1 * | 2/2010 | Gong | H02M 3/156 363/21.13 |
| 2015/0378378 | A1 * | 12/2015 | Zhang | H02M 1/4225 323/280 |
| 2016/0006336 | A1 * | 1/2016 | Bennett | H02M 3/158 323/271 |
| 2016/0352228 | A1 * | 12/2016 | Zhang | H02M 3/1582 |

(Continued)

OTHER PUBLICATIONS

Cheung Fai Lee, et al., "AA Monolithic Current-Mode CMOS DC-DC Converter With On-Chip Current-Sensing Technique," IEEE Journal of Solid-State Circuits, vol. 39 No. 1, Jan. 2004, pp. 3-14.

*Primary Examiner* — Kyle J Moody
(74) *Attorney, Agent, or Firm* — Kowert, Hood, Munyon, Rankin & Goetzel, P.C.

(57) ABSTRACT

A power converter circuit that includes a switch node coupled to a regulated power supply node via an inductor may, during a charge cycle, source current to the regulated power supply node. In response to initiating the charge cycle, a control circuit may generate a control current using a voltage level of the regulated power supply node and a reference voltage level. The control circuit may also halt the charge cycle using results from comparisons of the compensated and uncompensated versions of the inductor current to the control current.

20 Claims, 6 Drawing Sheets

(56) References Cited

U.S. PATENT DOCUMENTS

| | | | |
|---|---|---|---|
| 2017/0040892 A1* | 2/2017 | Rutkowski | H02M 3/158 |
| 2017/0222463 A1 | 8/2017 | Pullen et al. | |
| 2018/0262023 A1 | 9/2018 | Li | |
| 2020/0127566 A1* | 4/2020 | Lazaro | H02M 3/158 |

* cited by examiner

CURRENT MODE POWER CONVERTER WITH TRANSIENT RESPONSE COMPENSATION

BACKGROUND

Technical Field

Embodiments described herein relate to integrated circuits, and more particularly, to techniques for generating regulated power supply voltages.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generated regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments of a power converter circuit are disclosed. Broadly speaking, a power converter circuit is contemplated, in which a switch node is coupled to a regulated power supply node via an inductor. The power converter circuit may be configured to source a charge current to the switch node during a charge cycle. A control circuit may be configured, in response to an initiation of the charge cycle, generate a control current using a voltage level of the regulated power supply node and a reference voltage level. The control circuit may be further configured to perform a first comparison using the control current, a sensed inductor current, and a bias current, and perform a second comparison using the control current the sensed inductor current, and a slope compensation current. The control circuit may also be configured to halt the charge cycle using respective results of the first comparison and the second comparison. In another non-limiting embodiments, the control circuit may be configured to add the bias current to the sensed inductor current.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuit that includes both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a buck converter circuit. Such buck converter circuits include multiple devices and a switch node that is coupled to a regulated power supply node via an inductor. Particular ones of the multiple devices are then activated to periodically charge and discharge the switch node in order to maintain a desired voltage level on power supply node.

To determine the duration of either the charge cycle or discharge cycle, current mode control may be used in some power converter circuits in order to provide a desired transient response of the power converter circuit as well as balance currents in multi-phase power converter circuits. In a power converter circuit using current mode control, control circuits may generate a control current whose values is based, at least in part, on a comparison of a voltage level of the regulated power supply node and a reference voltage. The control current may then be compared to a current that is flowing through the inductor to determine the duration of the charge or discharge cycle.

In some cases, however, current mode control may result in a power converter circuit operating becoming unstable while operating in certain duty cycles. To improve the stability of the power converter circuit, slope compensation is often employed. When slope compensation is used in a power converter circuit, a current ramp signal with a fixed slope (referred to herein as a "slope compensation current," "compensation current," or "slope current") is combined with the sensed inductor current prior to comparison with the control current.

While improving the stability of the power converter circuit, slope compensation may result in other problems in the operation of the power converter circuit. When current demand of the load changes, there is a corresponding change in the value of the control current. The change in control current then results in a change in the current sourced to the load (referred to herein as a "charge current" or an "inductor current"). The change in inductor current is scaled by a value that is based on the slopes of the charge current and the slope compensation current. This scaling effect is illustrated in Equation 1, wherein $\Delta i_t$ is the change in inductor current, $\Delta i_c$ is a change in the control current, $m_L$, is the slope of the inductor current, and $m_{SC}$ is the slope of the slope compensation current. During subsequent cycles, the peak inductor current may continue to increase, until it has increased by $\Delta i_c$. In such cases, the inductor current may not reach the desired peak value as quickly as desired, resulting in drop in the output voltage of the power converter circuit.

$$\Delta i_L(t) = \frac{m_L}{m_L + m_{SC}} \Delta i_c \qquad (1)$$

The embodiments illustrated in the drawings and described below may provide techniques for operating a power converter circuit using an additional comparison of the control current with an uncompensated version of the sensed inductor current to extend a charge cycle of the power converter. By using an uncompensated version of the sensed inductor current in a second comparison, along with a correction to the slope compensation current, the error introduce by the slope compensation current can be reduced, thereby improving the accuracy of the regulation of the voltage level of the regulated power supply node and reducing droop at the output of the power converter circuit.

Figure 1:
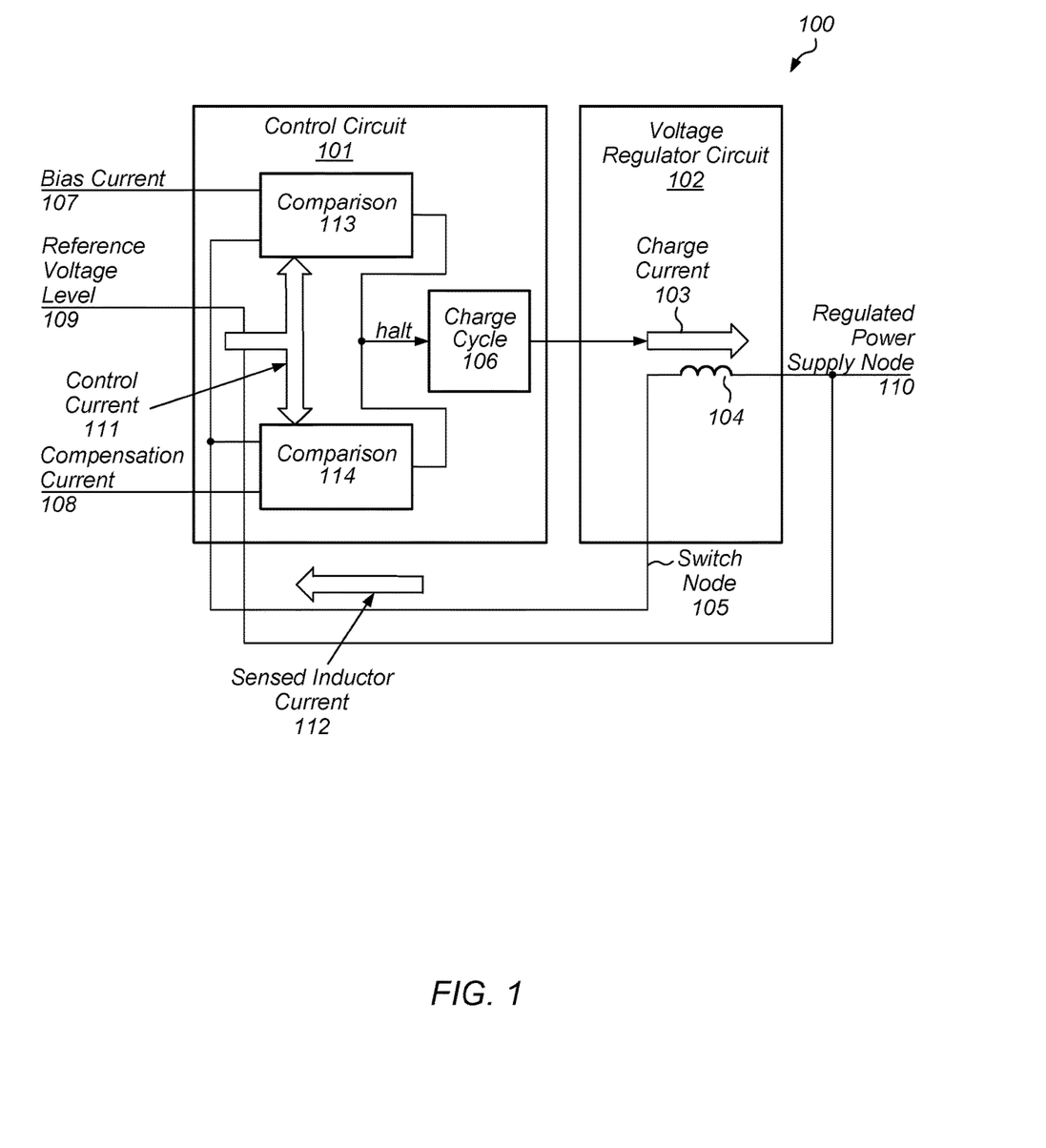
FIG. 1 illustrates a block diagram of an embodiment of a power converter circuit.

A block diagram depicting an embodiment of a power converter circuit is illustrated in FIG. 1. As illustrated, power converter circuit 100 includes control circuit 101 and voltage regulator circuit 102.

Voltage regulator circuit 102 includes switch node 105 coupled to regulated power supply node 110 via inductor 104. In various embodiments, voltage regulator circuit 102 is configured, in response to an initiation of charge cycle 106, to source charge current 103 to switch node 105. It is noted that although a single voltage regulator circuit is depicted in the embodiment of FIG. 1, in other embodiments, multiple voltage regulator circuits (collectively "phase units" or "phase circuits") may be coupled to regulated power supply node 110, in parallel, and operated with different timings (or "phases").

As noted above, the duration of charge and discharge cycles in a power converter circuit may be determined using current control. As illustrated in FIG. 1, control circuit 101 is configured, in response to an initiation of charge cycle 106, to generate control current 111 using a voltage level of regulated power supply node 110 and reference voltage level 109. In various embodiments, control circuit 101 initiates charge cycle 106 in response to an assertion of a clock or other timing signal. As described below in more detail, the clock or other timing signal may be used to set a latch circuit that is configured to generate a control signal used by voltage regulator circuit 102 to determine when to source charge current 103.

Control circuit 101 is further configured to perform comparison 113 using control current 111, sensed inductor current 112, and bias current 107. In some embodiments, control circuit 101 may add bias current 107 to sensed inductor current 112 prior to performing comparison 113. Sensed inductor current 112 may correspond to an amount of charge current 103 flowing through inductor 104. In some cases, a voltage drop across a series resistor, a transconductance amplifier, or any other suitable means, may be employed to generate sensed inductor current 112.

Bias current 107 may, in some embodiments, be generated internal to control circuit 101, while in other embodiments, a separate bias circuit may be employed to generate bias current 107. It is noted that in some cases, bias current 107 may be set during initial testing. In some cases, bias current 107 may be adjusted during operation based on one or more operating characteristics of power converter circuit 100. By employing bias current 107, control circuit 101 can increase the dynamic range of power converter circuit 100 by providing more time for charge current 103 to increase before charge cycle 106 is halted.

Additionally, control circuit 101 is configured to perform comparison 114 using sensed inductor current 112, and compensation current 108. In various embodiments, control circuit 101 may be configured to add compensation current 108 to sensed inductor current 112 and use the result sum to perform comparison 114. In some cases, control circuit 101 may be configured to generate compensation current 108 by increasing, in response to an assertion of a clock or other timing signal, a value of the slope compensation current using a fixed slope.

Using results from comparisons 113 and 114, control circuit 101 is further configured to halt a charge cycle 106. As described below in more detail, a logic circuit may combine the aforementioned results to generate a reset signal used to reset a latch circuit configured to generate a control signal for voltage regulator circuit 102. The logic circuit may include any suitable combination of logic gates and may be configured to perform any suitable logic operation, such as logical-AND. By halting charge cycle 106 based on results of both comparisons, control circuit 101 may allow extra time for charge current 103 to increase during transient responses, thereby providing additional current to a load circuit and less variation of the voltage level of regulated power supply node 110.

Figure 2:
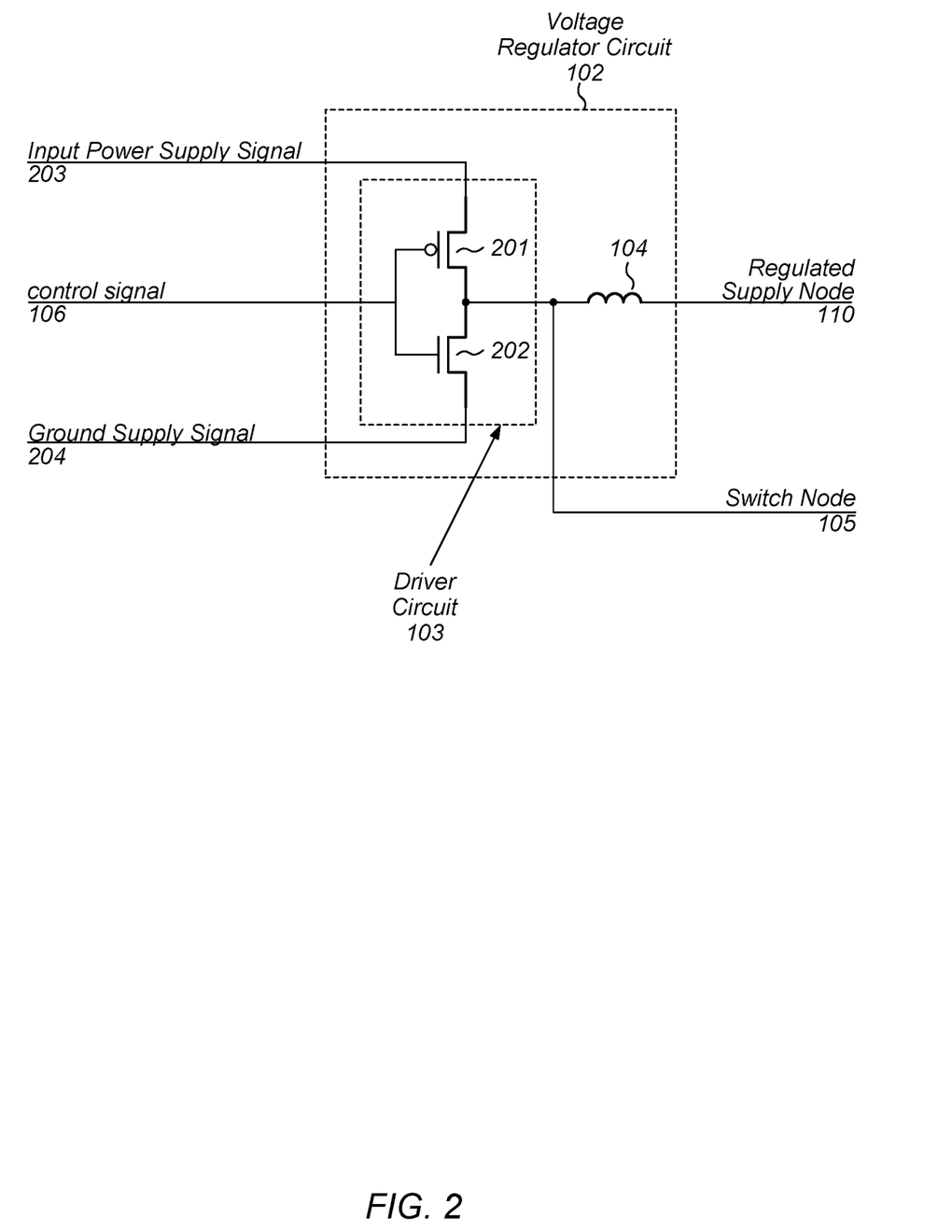
FIG. 2 illustrates schematic diagram of an embodiment of a regulator unit.

Voltage regulator circuits, such as voltage regulator circuit 102, may be designed according to one of various design styles. A schematic diagram of a particular embodiment of voltage regulator circuit 102 is depicted in FIG. 2. As illustrated, voltage regulator circuit 102 includes devices 201 and 202, which are both coupled to switch node 105, and controlled by control signal 205.

In various embodiments, control circuit 101 may generate control signal 205, which used to activate one of devices 201 and 202 during charge and discharge cycles. During a charge cycle, current is sourced from input power supply node 203 to regulated power supply node 110, and during a discharge cycle, current is sourced from ground supply node 204 to regulated power supply node 110. Alternating between charge and discharge cycles, and adjusting the duration of either of the charge or discharge cycles may maintain a desired voltage level maintained on regulated power supply node 110.

Device 201 is coupled between input power supply node 203 and switch node 105, and is controlled by control signal 205. During a charge cycle, control signal 205 is asserted, which activates device 201 and couples input power supply node 203 to switch node 105, thereby charging switch node 105 by allowing a current to flow from input power supply node 203 to switch node 105, and then onto regulated power supply node 110. As described below in more detail, the duration of the charge cycle may be based on a comparison of a generated current to a combination of generated and sensed currents.

As used herein, asserting, or an assertion of, a signal refers to setting the signal to a particular voltage level that activates a circuit or device coupled to the signal. The particular voltage level may be any suitable value. For example, in the case where device 201 is p-channel MOSFET, control signal 205 may be set to a voltage at or near ground potential when activated.

Device 202 is coupled between switch node 105 and ground supply node 204, and is also controlled by control signal 205. During a discharge cycle, control signal 205 is set to a voltage level, which activates device 202 and couples switch node 105 to ground supply node 204, thereby providing a conduction path from regulated power supply node 110 through inductor 104 into ground supply node 204. While device 202 is active, current flows from regulated power supply node 110 into ground supply node 204, decreasing the voltage level of regulated power supply node 110.

Device 201 and device 202 may be particular embodiments of MOSFETs. In particular, device 201 may be a particular embodiment of a p-channel MOSFET and device 202 may be a particular embodiment of an n-channel MOSFET. Although only two devices are depicted in the embodiment of FIG. 2, in other embodiments, any suitable number of devices, coupled in series or parallel, may be employed to achieve particular electrical characteristics (e.g., on-resistance of the devices).

Figure 3:
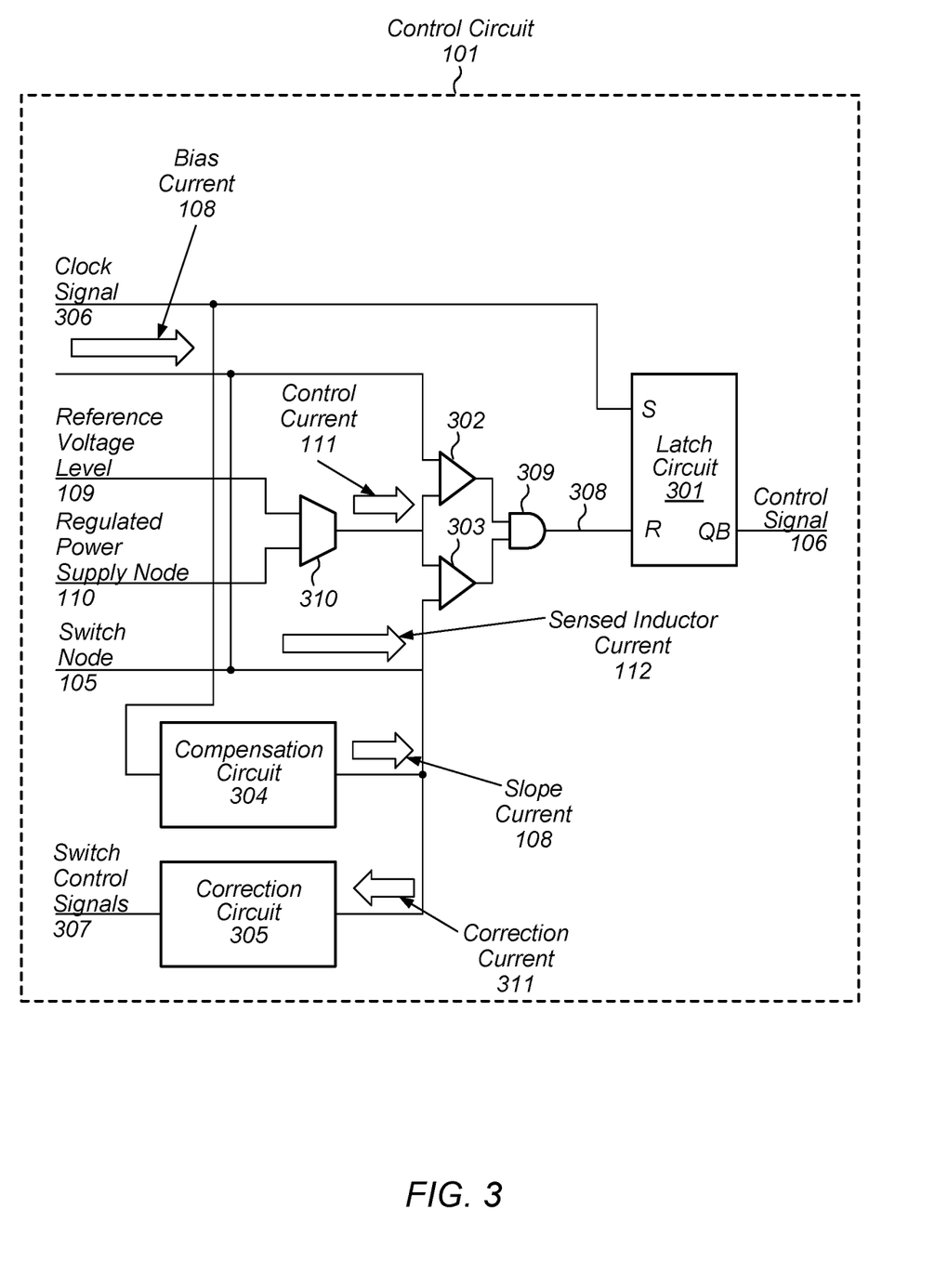
FIG. 3 illustrates a block diagram of an embodiment of a control circuit for a power converter circuit.

A block diagram of an embodiment of control circuit 101 is depicted in FIG. 3. As illustrated, control circuit 101 includes latch circuit 301, comparator circuits 302 and 303, compensation circuit 304, correction circuit 305, logic circuit 309, and error amplifier 310.

Latch circuit 301 may be a particular embodiment of a Set-Reset (SR) latch configured to set control signal 205 to a low logic value in response to an assertion of clock signal 306. Additionally, Latch circuit 301 is configured to set control signal 205 to a high logic level in response as assertion of a signal on node 308.

Latch circuit 301 may be designed according to one of various design style. In various embodiments, latch circuit 301 may include multiple logic gates, such as, cross-coupled NAND gates, or any other suitable combination of logic gates and/or MOSFETs to implement the functionality described above.

Comparator circuit 302 is coupled to logic circuit 309, and may be a particular embodiment of a differential amplifier configured to generate a signal at a first input of logic circuit 309 using control current 111 and a combination of sensed inductor current 112 and bias current 107. In various embodiments, comparator circuit 302 may be configured to set the first input of logic circuit 309 to particular digital voltage level using results of comparing control current 111 to the sum of bias current 107 and sensed inductor current 112. For example, when a value of control current 111 is substantially the same as the sum of bias current 107 and sensed inductor current 112, comparator circuit 302 may set the voltage level of the first input of logic circuit 309 to a voltage level corresponding to a high logic level.

Comparator circuit 303 is also coupled to logic circuit 309, as well as error amplifier 310, compensation circuit 304, and correction circuit 305, and is configured to generate a signal at a second input of logic circuit 309. Like comparator circuit 302, comparator circuit 303 may be a particular embodiment of a differential amplifier and may be configured to set the second input of logic circuit 309 to particular digital voltage level using results of comparing control current 111 to a combination of compensation current 108, correction current 311, and sensed inductor current 112. For example, when a value of control current 111 is substantially the same as the correction current 311 subtracted from a sum of compensation current 108 and sensed inductor current 112, comparator circuit 303 may set the voltage level of the second input of logic circuit 309 to a voltage level corresponding to a high logic level.

Logic circuit 309 is coupled to comparator circuits 302 and 303, and is also coupled to latch circuit 301 via node 308, and is configured to generate a voltage level on node 308. The voltage level generated on node 308 by logic circuit 309 may be based at least in part, on the voltage levels of respective outputs of comparator circuits 302 and 303. For example, in some embodiments, logic circuit 309 may set the voltage level on node 308 to a voltage level corresponding to a high logic level in response to the respective outputs of comparator circuits 302 and 303 both being at high logic levels. Logic circuit 309 may, in various embodiments, be a particular embodiment of an AND gate, which may be implemented as a combination of a NAND gate and an inverter.

Error amplifier 310 is coupled to comparator circuits 302 and 303, and may be a particular embodiment of a transconductance amplifier configured to generate control current 111. The value of control current 111 may be based, at least in part, on a comparison of reference voltage level 109 and the voltage level of regulated power supply node 110. In various embodiments, error amplifier 310 may amplify a difference between reference voltage level 109 and the voltage level of regulated power supply node 110, and convert the difference in voltage levels to control current 111.

Compensation circuit 304 is coupled to clock signal 306 and switch node 105, and is configured to generate compensation current 108. In various embodiments, compensation circuit 304 is configured to generate compensation current 108 in response to an assertion of clock signal 306. Compensation circuit 304 may be further configured to source (or add) compensation current 108 to sensed inductor current 112 to generate a sum of the two currents.

As noted above, compensation circuit 304 may be configured to generate compensation current 108 using a fixed slope. Compensation circuit 304 may be configured to generate compensation current 108 such that a value of compensation current 108 is proportional to a time from an assertion of clock signal 306. An example of the relationship for generating compensation current 108 is depicted in Equation 2, where $i_{compensation}$ is the time-domain value of compensation of compensation current 108, $m_{sc}$ is the fixed slope, and t is time. In various embodiments, when latch circuit 301 is reset, compensation circuit 304 may be configured to reset the value of compensation current 108 to at or near zero amperes.

$$i_{compensation}(t) = m_{sc} t \quad (2)$$

As described in co-pending application Ser. No. 16/508,910 titled "CURRENT MODE POWER CONVERTER WITH SLOPE COMPENSATION ERROR CONTROL," which is hereby incorporated by reference in its entirety as through fully and completely set forth herein, correction circuit 305 is coupled to comparator circuit 303 and switch node 105, and is configured to generate correction current 311 using switch control signals 307. It is noted that switch control signals 307 may generated internal to control circuit 101, or may be received by a circuit external to control circuit 101. Although depicted as a circuit block separate from compensation circuit 304, in other embodiments, correction circuit 305 may be included in compensation circuit 304.

Structures such as those shown in FIGS. 2 and 3 for generating a voltage level on a regulated power supply node may be referred to using functional language. In some embodiments, these structures may be described as including "a means for sourcing a charge current to the switch node during a charge cycle," "a means for, in response to an initiation of the charge cycle, generating a control current using a voltage level of the regulated power supply node and a reference voltage level," "a means for performing a first comparison using the control current, a sensed inductor current, and a bias current," "a means for performing a second comparison using the control current, the sense inductor current, and a slope compensation current" and "a means for halting the charge cycle using respective results of the first comparison and the second comparison."

The corresponding structure for "means for sourcing a charge current to the switch node during a charge cycle" is voltage regulator circuit 102 as well as equivalents of this circuit. The corresponding structure of "means for, in response to an initiation of the charge cycle, generating a control current using a voltage level of the regulated power supply node and a reference voltage level" is error amplifier 310 and its equivalents. The corresponding structure for "means for performing a first comparison using the control current, a sensed inductor current, and a bias current" is comparator circuit 302 and its equivalents, and the corresponding structure for "means for performing a second comparison using the control current, the sense inductor current, and a slope compensation current" is comparator circuit 303 as well as equivalents of this circuit. Latch circuit 301 and logic circuit 309, and their equivalents are the corresponding structure for "means for halting the charge cycle using respective results of the first comparison and the second comparison."

Figure 4:
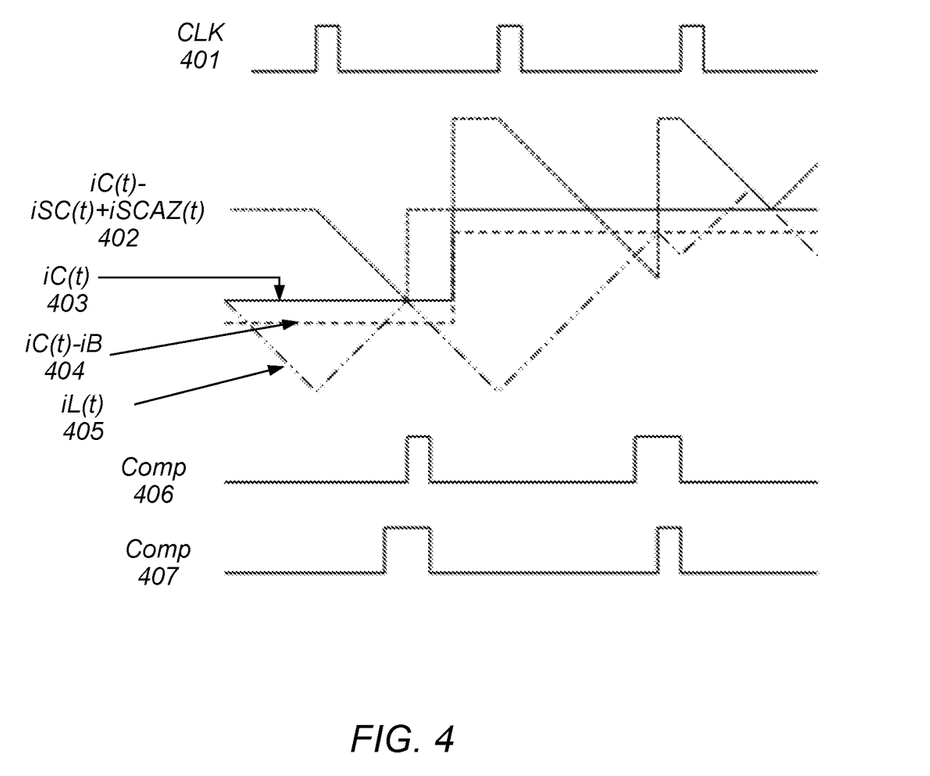
FIG. 4 illustrates example waveforms associated with the operation of a power converter circuit.

Waveforms illustrating the operation of power converter circuit 100 are depicted in FIG. 4. It is noted that the waveforms of FIG. 4 are merely examples, and that in other embodiments, the waveforms may appear different and the relative timings between waveforms may be different.

Charge cycle 106 may be initiated by a rising edge of CLK 401, which may correspond to clock signal 306 as illustrated in FIG. 3. Once charge cycle 106 is initiated, charge current 103 is source to switch node 105 resulting in sensed inductor current 112 increasing, which is denoted by iL(t) 405. As a further aid in illustrating the operation, control current 111 (denoted as iC(t) 403), as well as combined current input to comparator circuit 303 (denoted as iC(t)-iSC(t)+iSCAZ(t) 402) and the combined input to comparator circuit 302 (denoted as iC(t)-iB 404), are also depicted.

Charge cycle 106 will continue until the respective outputs of comparator circuits 302 and 303 are both at high logic levels. As illustrated, the output of comparator circuit 302 corresponds to comp 407, and the output of comparator circuit 303 corresponding to comp 406. Once both comp 406 and comp 407 are at high logic levels, charge cycle 106 halts, and iL(t) 405 begins to decrease as voltage regulator circuit 102 stops sourcing current to switch node 105 and begins sinking current from the switch node.

During steady-state operation, comparator circuit 303 is triggered before comparator circuit 302, due to the application of bias current 107. In this case, the operation is similar to that of current control loop that employs a single comparator. During a transient event, however, comparator circuit 303 does not trigger until the sensed inductor current 112 is within bias current 107 of control current 111. The delay in the triggering of comparator circuit 303 results in an extension of charge cycle 106, thereby allowing the inductor current to continue to increase in iL(t) 405. The extension of the charge cycle 106, allows for the inductor current to rise faster in response to a change in the load, providing an improved transient response.

Figure 5:
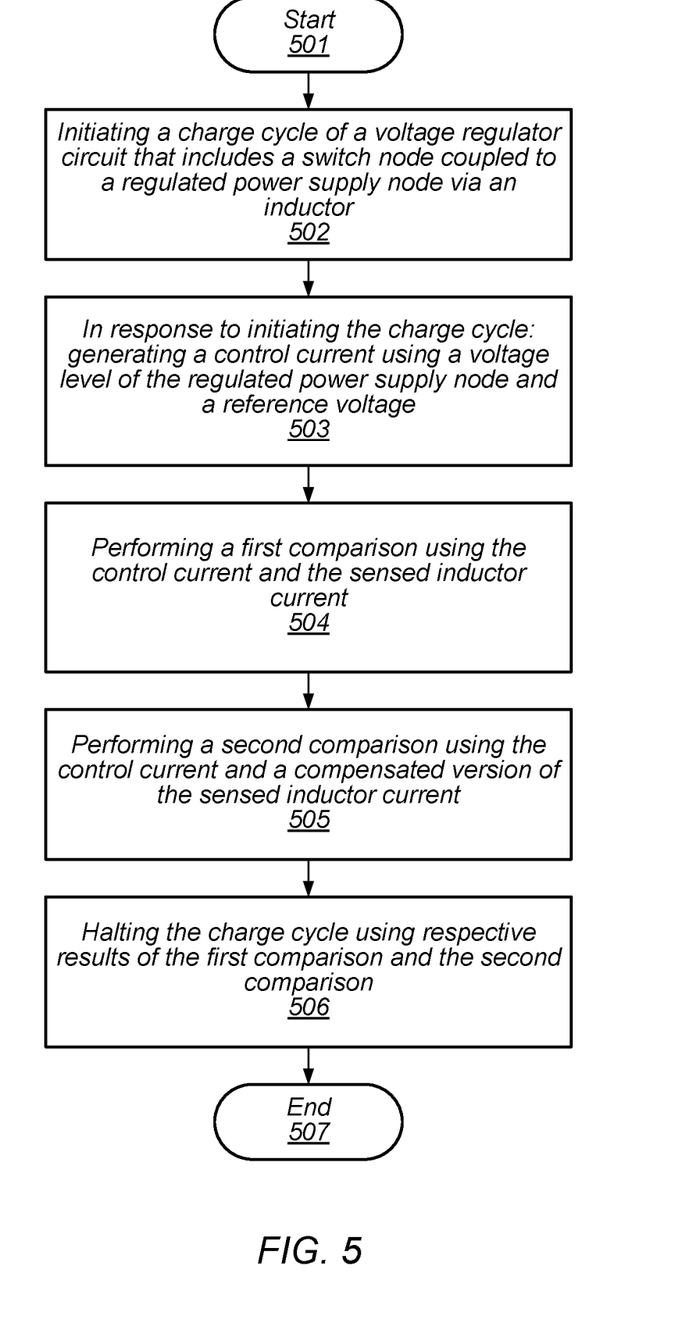
FIG. 5 illustrates a flow diagram depicting an embodiment of a method for operating a power converter circuit.

Turning to FIG. 5, a flow diagram depicting an embodiment of a method for operating a power converter circuit is illustrated. The method, which may be applied to power converter circuit 100 as depicted in FIG. 1, begins in block 501.

The method includes initiating a charge cycle of a voltage regulator circuit that includes a switch node coupled to a regulated power supply node via an inductor (block 502). In various embodiments, the method may include initiating the charge cycle in response to an assertion of a clock signal. In some cases, the method may also include setting a latch circuit using the clock signal and generating a control signal using an output of the latch circuit.

The method also includes, in response to initiating the charge cycle, generating a control current using a voltage level of the regulated power supply node and a reference voltage (block 503). In some embodiments, the method may include amplifying a difference between the voltage level of the regulated power supply node and the reference voltage level to generate the control current.

The method also includes performing a first comparison using the control current and a sensed inductor current. (block 504). In some embodiments, the method may include generating a particular voltage level corresponding to a difference between the control current and the sensed inductor current. In some cases, the method may include performing the first comparison using the control current and a sum of the sensed inductor current and a bias current.

The method further includes performing a second comparison using the control current and a compensated version of the sensed inductor current (block 505). In various embodiments, the method may include generating the compensated version of the sensed inductor current using the sensed inductor current, a slope current, and a correction current. The method may, in some embodiments, include converting the slope current to a first voltage level and sampling the first voltage level during a first time period. In such cases, the method may also include filtering, during a second time period subsequent to the first time period, the sampled voltage level to generate a second voltage level, and generating the correction current using the second voltage level.

The method also includes halting the charge cycle using respective results of the first comparison and the second comparison (block 506). In some embodiments, halting the charge cycle may include resetting the latch circuit, and changing a value of the control signal using the output of the latch circuit subsequent to resetting the latch circuit. The method concludes in block 507.

Figure 6:
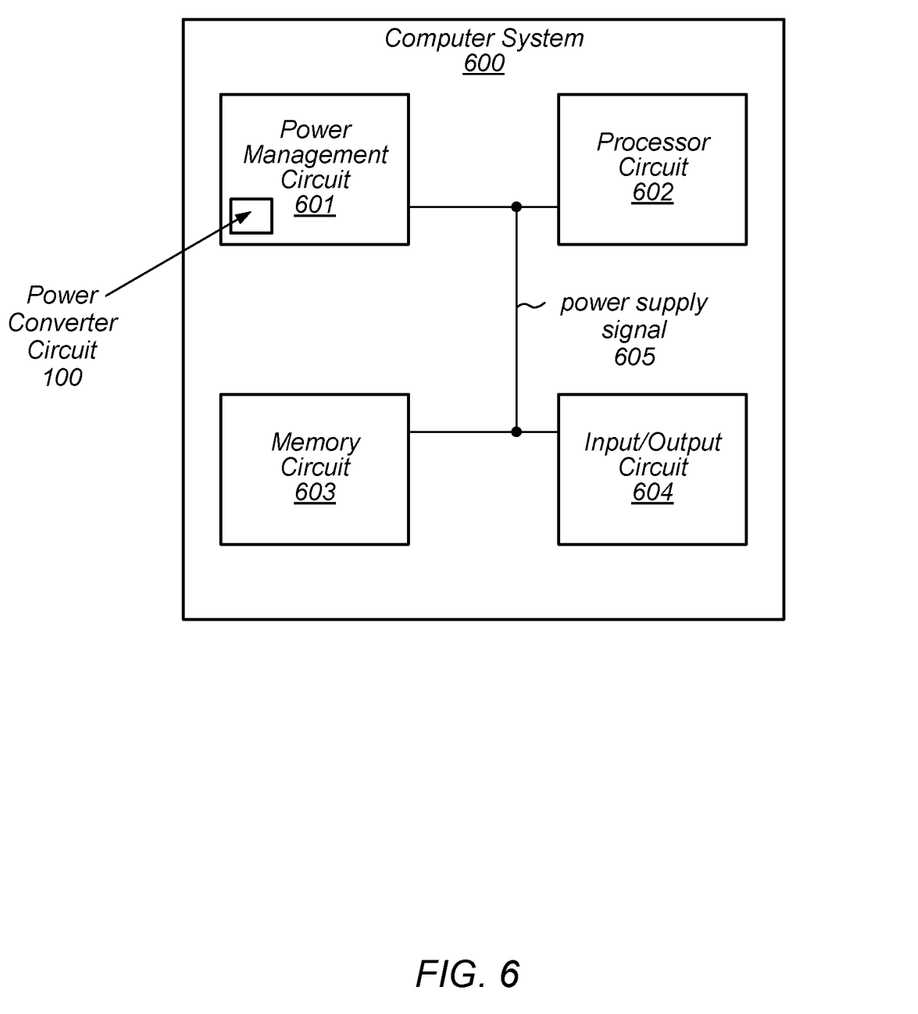
FIG. 6 depicts a block diagram of a computer system.

A block diagram of computer system is illustrated in FIG. 6. In the illustrated embodiment, the computer system 600 includes power management circuit 601, processor circuit 602, memory circuit 603, and input/output circuits 604, each of which is coupled to power supply signal 605. In various embodiments, computer system 600 may be a system-on-a-chip (SoC) and/or be configured for use in a desktop computer, server, or in a mobile computing application such as, e.g., a tablet, laptop computer, or wearable computing device.

Power management circuit 601 includes power converter circuit 100, which is configured to generate a regulated voltage level on power supply signal 605 in order to provide power to processor circuit 602, memory circuit 603, and input/output circuits 804. Although power management circuit 601 is depicted as including a single power converter circuit, in other embodiments, any suitable number of power converter circuits may be included in power management circuit 601, each configured to generate a regulated voltage level on a respective one of multiple internal power supply signals included in computer system 600. In cases where multiple power converter circuits are employed, two or more of the multiple power converter circuits may be connected to a common set of power terminals that connections to power supply signals and ground supply signals of computer system 600.

Processor circuit 602 may, in various embodiments, be representative of a general-purpose processor that performs computational operations. For example, processor circuit 602 may be a central processing unit (CPU) such as a microprocessor, a microcontroller, an application-specific integrated circuit (ASIC), or a field-programmable gate array (FPGA).

Memory circuit 603 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 6, in other embodiments, any suitable number of memory circuits may be employed.

Input/output circuits 604 may be configured to coordinate data transfer between computer system 600 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 604 may also be configured to coordinate data transfer between computer system 600 and one or more devices (e.g., other computing systems or integrated circuits) coupled to computer system 600 via a network. In one embodiment, input/output circuits 604 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
  a voltage regulator circuit that includes a switch node coupled to a regulated power supply node via an inductor, wherein the voltage regulator circuit is configured to source a charge current to the switch node during a charge cycle; and
  a control circuit configured to:
    in response to an initiation of the charge cycle:
      generate a control current using a voltage level of the regulated power supply node and a reference voltage level;
      perform a first comparison using the control current, and a bias current;
      perform a second comparison using the control current, a sensed inductor current, and a slope compensation current; and halt the charge cycle using respective results of the first comparison and the second comparison.

2. The apparatus of claim 1, wherein a value of the bias current is based on one or more operating characteristics of the voltage regulator circuit.

3. The apparatus of claim 1, wherein to perform the second comparison, the control circuit is configured to add the slope compensation current to the sensed inductor current.

4. The apparatus of claim 3, wherein the control circuit is further configured to subtract a correction current from a sum of the slope compensation current and the sensed inductor current.

5. The apparatus of claim 1, wherein the control circuit is further configured to initiate the charge cycle in response to an assertion of a clock signal.

6. The apparatus of claim 5, wherein the control circuit is further configured to generate the slope compensation current by increasing, in response to the assertion of the clock signal, a value of the slope compensation current using a fixed slope.

7. A method, comprising:
initiating a charge cycle of a voltage regulator circuit that includes a switch node coupled to a regulated power supply node via an inductor;
in response to initiating the charge cycle:
generating a control current using a voltage level of the regulated power supply node and a reference voltage level;
performing a first comparison using the control current and a bias current; and
performing a second comparison using the control current and a compensated version of a sensed inductor current; and
halting the charge cycle using respective results of the first comparison and the second comparison.

8. The method of claim 7, further comprising, generating a particular voltage level corresponding to a difference between the control current and the bias current.

9. The method of claim 7, wherein a value of the bias current is based on one or more operating characteristics of the voltage regulator circuit.

10. The method of claim 7, further comprising, generating the compensated version of the sensed inductor current using the sensed inductor current, a slope current, and a correction current.

11. The method of claim 10, further comprising:
converting the slope current to a first voltage level;
sampling the first voltage level during a first time period to generate a sampled voltage level;
filtering, during a second time period subsequent to the first time period, the sampled voltage level to generate a second voltage level; and
generating the correction current using the second voltage level.

12. The method of claim 7, further comprising, amplifying a difference between the voltage level of the regulated power supply node and the reference voltage level to generate the control current.

13. The method of claim 7, further comprising, initiating the charge cycle, in response to an assertion of a clock signal.

14. An apparatus, comprising:
a voltage regulator circuit including a switch node coupled to a regulated power supply node via an inductor, wherein the voltage regulator circuit is configured to source a charge current to the switch node, in response to an activation of a control signal;
a latch circuit configured to activate the control signal;
an error amplifier circuit configured to generate a control current using a voltage level of the regulated power supply node and a reference voltage;
a first comparator circuit configured to perform a first comparison using the control current, and a bias current;
a second comparator circuit configured to perform a second comparison using the control current, a sensed inductor current, and a slope compensation current; and
a logic circuit configured to assert a reset signal using results of the first and second comparison; and
wherein the latch circuit is further configured to deactivate the control signal in response to an activation of the reset signal.

15. The apparatus of claim 14, further comprising a compensation circuit configured to generate the slope compensation current using a clock signal.

16. The apparatus of claim 15, wherein the compensation circuit is further configured to generate the slope compensation current by increasing, in response to an assertion of the clock signal, a value of the slope compensation current using a fixed slope.

17. The apparatus of claim 15, further comprising a correction circuit configured to subtract a correction current from a sum of the sensed inductor current and the slope compensation current, wherein a value of the correction current is based on a value of the slope compensation current.

18. The apparatus of claim 14, wherein the latch circuit is configured to activate the control signal in response to an assertion of a clock signal.

19. The apparatus of claim 14, wherein the error amplifier circuit is further configured to generate the control current with a value proportional to a difference between the voltage level of the regulated power supply node and the reference voltage.

20. The apparatus of claim 14, wherein a value of the bias current is based on one or more operating characteristics of the voltage regulator circuit.

* * * * *